US 6,703,863 B2

(12) United States Patent
Gion

(10) Patent No.: US 6,703,863 B2
(45) Date of Patent: Mar. 9, 2004

(54) LEVEL SHIFT CIRCUIT

(75) Inventor: Masahiro Gion, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/337,429

(22) Filed: Jan. 7, 2003

(65) Prior Publication Data

US 2003/0132778 A1 Jul. 17, 2003

(30) Foreign Application Priority Data

Jan. 15, 2002 (JP) ........................................ 2002-005576
Nov. 21, 2002 (JP) ........................................ 2002-338340

(51) Int. Cl.$^7$ .................................................. H03K 19/0175
(52) U.S. Cl. ........................ 326/62; 326/63; 327/534; 327/535
(58) Field of Search ............................ 326/62–89, 110, 326/58, 27; 327/534, 535

(56) References Cited

U.S. PATENT DOCUMENTS

| | | | | |
|---|---|---|---|---|
| 5,361,003 A | * | 11/1994 | Roberts | ........................ 326/21 |
| 5,821,769 A | | 10/1998 | Douseki | |
| 5,821,800 A | * | 10/1998 | Le et al. | ........................ 327/333 |
| 6,066,975 A | * | 5/2000 | Matano | ........................ 327/333 |
| 6,163,179 A | * | 12/2000 | Huang et al. | ........................ 327/108 |
| 6,246,288 B1 | * | 6/2001 | Yamamoto | ........................ 330/253 |
| 6,404,229 B1 | * | 6/2002 | Barnes | ........................ 326/68 |
| 6,456,120 B1 | * | 9/2002 | Huang | ........................ 326/115 |
| 6,466,054 B2 | * | 10/2002 | Kameyama et al. | .......... 326/68 |
| 6,580,291 B1 | * | 6/2003 | Lutley | ........................ 326/81 |

FOREIGN PATENT DOCUMENTS

JP          9-121152          5/1997

* cited by examiner

*Primary Examiner*—Michael Tokar
*Assistant Examiner*—Linh Van Nguyen
(74) *Attorney, Agent, or Firm*—McDermott, Will & Emery

(57) ABSTRACT

In a level shift circuit according to the invention, either an input signal IN or an inverted input signal XIN, which are input into the gate electrodes of n-type transistors for signal input, is also given to the substrate of that n-type transistor via p-type transistors for substrate bias. When the signal IN or XIN rises and changes, the threshold voltages of the n-type transistors for signal input is lowered due to the substrate bias effect. Consequently, even if the signal IN or XIN has a low voltage level, operation is carried out at high speeds. Also, when either an output signal OUT or an inverted output signal XOUT is changed to a high voltage level, the transistors for substrate bias become non-conducting, and thus the input signal IN or the inverted input signal XIN is not supplied to the substrate of the n-type transistors for signal input other than when the signal is changing. Consequently, a constant passing-through current does not flow to the substrate of these transistors.

12 Claims, 10 Drawing Sheets

LEVEL SHIFT CIRCUIT

BACKGROUND OF THE INVENTION

The present invention relates to level shift circuits used as interfaces between circuits with different power source voltages.

As processing has become increasingly miniaturized in recent years, there has been a tendency toward reducing the power source voltage of circuits in semiconductor integrated circuits for the sake of element reliability. On the other hand, the same conventional power source voltage continues to be used for some of the elements employed in systems such as electrical appliances. An interface is generally established between elements and semiconductor integrated circuits with different power source voltages by providing a level shift circuit within the semiconductor integrated circuits.

Also, in some recent semiconductor integrated circuits, an optimal power source voltage is supplied to each circuit block to reduce power consumption, and level shift circuits are also used to establish an interface between these circuit blocks with different power source voltages. It is likely that the need for such level shift circuits will continue to increase in the future.

An example of a conventional level shift circuit is shown in FIG. 13. In FIG. 13, numerals 1 and 2 denote n-channel transistors, 3 and 4 denote p-channel transistors, VDD denotes a high voltage power source, VSS denotes a ground power source, IN denotes an input signal, XIN denotes an inverted input signal, OUT denotes an output signal, and XOUT denotes an inverted output signal. For the n-channel transistors 1 and 2, at their gate electrodes are input the input signal IN and the inverted input signal XIN, respectively, and their source electrodes are connected to the ground power source VSS. The drain electrodes of the p-channel transistors 3 and 4 are connected to the drain electrodes of the n-channel transistors 1 and 2, and their source electrodes are connected to the high voltage power source VDD. The p-channel transistors 3 and 4 are connected in a cross-coupled arrangement, in which the gate electrode of one is connected to the drain electrode of the other. The inverted output signal XOUT is output from the point where the p-channel transistor 3 and the n-channel transistor 1 are connected, and the output signal OUT is output from the point where the p-channel transistor 4 and the n-channel transistor 2 are connected.

Next, the operation of this conventional level shift circuit is described. As one example, the operation will be described with an amplitude level of the input signal IN and the inverted input signal XIN at 1.5 V, a power source potential of the high voltage power source VDD at 3 V, the potential of the ground power source VSS at 0 V, and an amplitude level of the output signal OUT and the inverted output signal XOUT at 3 V.

First, as the initial state, the input signal IN is set to 0 V, the inverted input signal XIN is set to 1.5 V, the output signal OUT is set to 0 V, and the inverted output signal XOUT is set to 3 V At this time, the n-channel transistor 1 and the p-channel transistor 4 are in a non-conducting state and the n-channel transistor 2 and the p-channel transistor 3 are in a conducting state.

Next, let us consider a case in which the input signal IN is changed to 1.5 V and the inverted input signal XIN is changed to 0 V Due to this change, the n-channel transistor 1 is shifted into a conducting state and the n-channel transistor 2 is shifted into a non-conducting state. At this time, because the p-channel transistor 3 is in a conducting state, the potential of the inverted output signal XOUT drops to an intermediate value determined by the ratio of the conduction resistances of the n-channel transistor 1 and the p-channel transistor 3. When this intermediate value exceeds the threshold voltage of the p-channel transistor 4, the p-channel transistor 4 is shifted into a conducting state and the potential of the output signal OUT is stepped up. When the potential of the output signal OUT is stepped up, the p-channel transistor 3 is shifted to a non-conducting state, and as a result the conduction resistance of the p-channel transistor 3 is increased and the potential of the inverted output signal XOUT is dropped further.

With the above-described positive feedback, the operation for changing the output signal OUT to 3 V and the inverted output signal XOUT to 0 V and thereby shifting the input signal, which has a low amplitude level, to an output signal that has a large amplitude level is completed. Thus, for example, a signal with a low power source voltage level inside a semiconductor integrated circuit can be shifted to an outside signal with a high power source voltage level.

However, with conventional level shift circuits, it was found that the following problem becomes noticeable when the power source voltage is reduced. That is, in the level shift circuit shown in FIG. 13, high withstand voltage transistors with a thick gate oxide film able to withstand high voltages are used for the n-channel transistors 1 and 2, and these high voltage resistance transistors generally have a large threshold voltage (for example, 0.5 V). Thus, when the voltage levels of the input signal IN and the inverted input signal XIN have dropped to near the threshold voltage of the n-channel transistors 1 and 2 (for example, to 0.7 V), the n-channel transistors 1 and 2, into whose gate electrodes the signals IN and XIN are input, experience a very rapid decline in performance. As a result, when the signals IN and XIN are changed from 0 V to a predetermined voltage level (0.7 V), a problem that occurs is that the operation for shifting to the conducting state of the n-channel transistors 1 and 2 is slow, resulting in poorer overall operating speed of the level shift circuit.

As mentioned above, the recent progress in miniaturization has tended toward a reduction in the power source voltage inside semiconductor integrated circuits. Thus, how these low voltage level signals will be shifted to a high voltage level at high speeds becomes a crucial problem as progress in achieving progressively lower voltage levels continues.

SUMMARY OF THE INVENTION

It is an object of the present invention to achieve a level shift circuit for shifting an input signal with a low voltage level to an output signal with a high voltage level that performs this signal level shift at high speeds and low power, even if innovations continue to reduce the voltage level of the input signal.

To achieve the above object, the present invention utilizes the effects of transistor substrate biasing, so that in a transistor into which is input an input signal at its gate electrode, a positive voltage is applied to the substrate of the transistor only when the input signal changes as it rises to the power source voltage level, so as to lower the threshold voltage and achieve higher operating speeds for the transistor.

More specifically, a level shift circuit of the invention, into which an input signal and an inverted input signal are input, which shifts an amplitude level of the input signal and the inverted input signal to an amplitude level that is higher than that amplitude level, and which outputs at least one of an output signal and an inverted output signal having the amplitude level after shifting, and includes a first n-type transistor for signal input into whose gate electrode the input signal is input, a second n-type transistor for signal input into whose gate electrode the inverted input signal is input, a first p-type transistor for substrate bias, into whose source electrode the input signal is input, whose drain electrode is connected to a substrate of the first n-type transistor for signal input, and into whose gate electrode the output signal is input, and a second p-type transistor for substrate bias, into whose source electrode the inverted input signal is input, whose drain electrode is connected to a substrate of the second n-type transistor for signal input, and into whose gate electrode the inverted output signal input.

In another aspect of the invention, the level shift circuit further includes a first n-type transistor for resetting, whose source electrode is connected to a low voltage power source, whose drain electrode is connected to the substrate of the first n-type transistor for signal input, and into whose gate electrode the output signal is input, and a second n-type transistor for resetting, whose source electrode is connected to the low voltage power source, whose drain electrode is connected to the substrate of the second n-type transistor for signal input, and into whose gate electrode the inverted output signal is input.

In a further aspect of the invention, the level shift circuit includes a first delay element connected to the gate electrode of the first n-type transistor for resetting, and which is for delaying input of the output signal to that gate electrode, and a second delay element connected to the gate electrode of the second n-type transistor for resetting, and which is for delaying input of the inverted output signal to that gate electrode.

In a yet further aspect of the invention, in the level shift circuit, the inverted output signal and the output signal are input into the drain electrodes of the first and the second n-type transistors for signal input, respectively, and the level shift circuit further includes a p-type transistor for blocking, which is arranged on a route connecting a high voltage power source to the drain electrodes of the first and the second n-type transistors for signal input, into whose gate electrode a control signal is input and which becomes non-conducting when a power source of a circuit that outputs the input signal and the inverted input signal is shut down, and first and second n-type transistors for shutdown, arranged between the drain electrodes of the first and the second n-type transistors for signal input and the low voltage power source, respectively, into whose gate electrodes the control signal is input and which become conducting during the shut down.

In another aspect of the invention, in the level shift circuit, at least the first and the second n-type transistors for signal input are formed on an insulating substrate.

In an even further aspect of the invention, in the level shift circuit, a signal line is connected to the drain electrode of at least one of the first and the second n-type transistors for signal input, and through the signal line, only one of the output signal and the inverted output signal is output.

A further level shift circuit according to the invention, into which an input signal and an inverted input signal are input, which shifts an amplitude level of the input signal and the inverted input signal to an amplitude level that is higher than that amplitude level, and which outputs at least one of an output signal and an inverted output signal, which is the output signal inverted, having the amplitude level after shifting, and includes a first n-type transistor for signal input, into whose gate electrode the input signal is input, a second n-type transistor for signal input, into whose gate electrode the inverted input signal is input, a first n-type transistor for substrate bias, into whose source electrode the input signal is input, whose drain electrode is connected to a substrate of the first n-type transistor for signal input, and into whose gate electrode the inverted output signal is input, and a second n-type transistor for substrate bias, into whose source electrode the inverted input signal is input, whose drain electrode is connected to a substrate of the second n-type transistor for signal input, and into whose gate electrode the output signal is input.

In another aspect of the invention, the level shift circuit further includes a first n-type transistor for resetting, whose source electrode is connected to a low voltage power source, whose drain electrode is connected to the substrate of the first n-type transistor for signal input, and into whose gate electrode the output signal is input, and a second n-type transistor for resetting, whose source electrode is connected to the low voltage power source, whose drain electrode is connected to the substrate of the second n-type transistor for signal input, and into whose gate electrode the inverted output signal is input.

In a further aspect of the invention, the level shift circuit includes a first delay element connected to the gate electrode of the first n-type transistor for resetting, and which is for delaying input of the output signal to that gate electrode, and a second delay element connected to the gate electrode of the second n-type transistor for resetting, and which is for delaying input of the inverted output signal to that gate electrode.

In a yet further aspect of the invention, in the level shift circuit, the inverted output signal and the output signal are input into the drain electrodes of the first and the second n-type transistors for signal input, respectively, and the level shift circuit further includes a p-type transistor for blocking, which is arranged on a route connecting a high voltage power source to the drain electrodes of the first and the second n-type transistors for signal input, into whose gate electrode a control signal is input and which becomes non-conducting when a power source of a circuit that outputs the input signal and the inverted input signal is shut down, and first and second n-type transistors for shutdown, arranged between the drain electrodes of the first and the second n-type transistors for signal input and the low voltage power source, respectively, into whose gate electrodes the control signal is input and which become conducting during the shut down.

In another aspect of the invention, in the level shift circuit, at least the first and the second n-type transistors for signal input are formed on an insulating substrate.

In an even further aspect of the invention, in the level shift circuit, a signal line is connected to the drain electrode of at least one of the first and the second n-type transistors for signal input, and through the signal line, only one of the output signal and the inverted output signal is output.

Thus, with the invention, when the input signal or the inverted input signal rises toward a higher voltage level, that signal is also applied to the substrate of the first or the second n-type transistor for signal input into whose gate the signal is input. As a result, the threshold voltage of the first or the second n-type transistor for signal input is lowered due to the substrate bias effect, and thus can quickly operate in a conductive state, even if the input signal or the inverted input signal has been reduced to a low voltage level.

Moreover, after the input signal or the inverted input signal has risen to a high voltage level, the potential of the output signal or the inverted output signal become high voltage and the corresponding first or second p- or n-type transistor for substrate bias is shifted to a non-conducting state, so that these signals are prevented from being applied to the substrate of the first or the second n-type transistor for signal input, except for when the signals are rising and changing. Consequently, a constant flow of passing-through current can be prevented from flowing to the substrate of the first or the second n-type transistor for signal input, and this lowers power consumption.

In addition, with the invention, for example, when the output signal has risen to a high voltage level due to the rise in the input signal, this output signal causes the first n-type transistor for resetting to become conducting and the substrate of the first n-type transistor for signal input, into whose gate electrode the input signal is input, to be reset to the potential of the low voltage power source, thereby preparing for the next rise in the input signal. Thus, a history effect in the operations of the first n-type transistor for signal input is inhibited, thereby effectively inhibiting variation in the operation delay of the transistor.

Moreover, with the invention, the resetting operation of the first and the second n-type transistors for resetting is delayed by the corresponding first and second delay elements, and thus high-speed operation resulting from biasing the substrate of the first and the second n-type transistors for signal input is maintained until the change in the signals is complete.

In addition, with the invention, when the power source of the circuit supplying the input signal and the inverted input signal is shut down, the potential level of the input signal and the inverted input signal becomes unstable, and together with this the first and the second n-type transistors for signal input become conductive, which leads to the risk that passing-through current will flow within the level shift circuit, however, at this time, the p-type transistor for blocking becomes non-conductive and the first and the second n-type transistors for shut down become conducting, thereby blocking the passing-through current route from the high voltage power source of the level shift circuit to the first and the second n-type transistors for signal input, and thus the flow of passing-through current during shut down is prevented. Also, because the output signal and the inverted output signal are held constant at the ground potential, passing-through current can be kept from flowing to circuits in later stages.

In addition to this, with the invention the first and the second n-type transistors for signal input are formed on an insulating substrate, so that an isolation region for isolating the substrates of these transistors from one another becomes unnecessary, allowing the layout area to be reduced.

DETAILED DESCRIPTION OF THE INVENTION

Hereinafter, preferable embodiments of the invention are described with reference to the appended drawings.

EMBODIMENT 1

Figure 1:
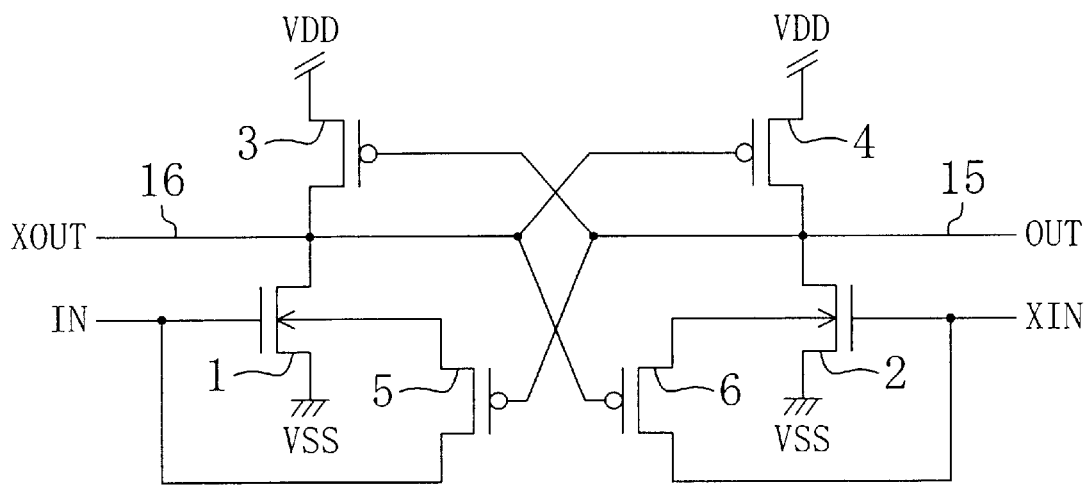
FIG. 1 is a diagram showing the configuration of the level shift circuit of Embodiment 1 according to the invention.

FIG. 1 shows the level shift circuit according to Embodiment 1 of the invention. In FIG. 1, VDD denotes a high voltage power source, VSS denotes a ground power source, IN denotes an input signal, XIN denotes an inverted input signal, OUT denotes an output signal, and XOUT denotes an inverted output signal.

Also, reference numeral 1 denotes a first n-channel transistor for signal input, into whose gate electrode the input signal IN is input, and 2 denotes a second n-channel transistor for signal input, into whose gate electrode the inverted input signal XIN is input. The source electrodes of the transistors 1 and 2 are connected to the ground power source VSS. Reference numerals 3 and 4 denote first and second p-channel transistors, respectively, whose source electrodes are connected to the high voltage power source VDD. The two p-channel transistors 3 and 4 are connected in a cross-coupled arrangement, in which the gate electrode of one p-channel transistor is connected to the drain electrode of the other p-channel transistor. The drain electrode of the second p-channel transistor 4 is connected to the drain electrode of the second n-channel transistor 2 for signal input, a signal line 15 is connected to the point where the transistors 2 and 4 are connected, and the output signal OUT is output from the signal line 15. Similarly, the drain electrode of the first p-channel transistor 3 is connected to the drain electrode of the first n-channel transistor 1 for signal input, a signal line 16 is connected to the point where the transistors 1 and 3 are connected, and the inverted output signal XOUT is output from the signal line 16.

Next, first and second p-channel transistors 5 and 6 for substrate bias are provided. This is a characteristic of the invention. Into the source electrode of the first p-channel transistor 5 for substrate bias the input signal IN is input, its drain electrode is connected to the substrate of the first n-channel transistor 1 for signal input, and at its gate electrode the output signal OUT of the signal line 15 is input. On the other hand, at the source electrode of the second p-channel transistor 6 for substrate bias the inverted input signal XIN is input, its drain electrode is connected to the substrate of the second n-channel transistor 2 for signal input, and at its gate electrode the inverted output signal XOUT of the signal line 16 is input.

Next, the operation of the level shift circuit of this embodiment is described. As one example, the operation will be described with an amplitude level of the input signal IN and the inverted input signal XIN at 0.7 V, a power source potential of the high voltage power source VDD at 3 V, a potential of the ground power source VSS 0 V, and an amplitude level of the output signal OUT and the inverted output signal XOUT at 3 V.

First, as an initial state, the input signal IN is set to 0 V, the inverted input signal XIN is set to 0.7 V, the output signal OUT is set to 0 V, and the inverted output signal XOUT is set to 3 V. At this time, the first n-channel transistor 1 for signal input, the p-channel transistor 4, and the second p-channel transistor 6 for substrate bias are in a non-conducting state, whereas the second n-channel transistor 2 for signal input, the p-channel transistor 3, and the first p-channel transistor 5 for substrate bias are in a conducting state.

Next, let us consider a case in which the input signal IN is changed to 0.7 V and the inverted input signal XIN is changed to 0 V. Due to this change in potential, the first n-channel transistor 1 for signal input is shifted into a conducting state and the second n-channel transistor 2 for signal input is shifted into a non-conducting state. At this time, because the first p-channel transistor 5 for substrate bias is in a conducting state, the voltage of the input signal IN is applied to the substrate of the first n-channel transistor 1 for signal input after passing through the transistor 5 for substrate bias. Thus, a substrate bias effect occurs in the first n-channel transistor 1 for signal input, which lowers its threshold voltage and allows the transistor to be very rapidly shifted into a conducting state. Consequently, the level shift circuit of the present embodiment allows high-speed operation to be ensured even if progress results in further reduction of the voltage of the input signal IN.

The following operation is subsequently performed. That is, as mentioned above, when the first n-channel transistor 1 for signal input becomes conducting, the potential of the inverted output signal XOUT drops to an intermediate value determined by the ratio of the conduction resistances of the n-channel transistor 1 and the p-channel transistor 3 because the p-channel transistor 3 is also conductive. When this intermediate value exceeds the threshold voltage of the p-channel transistor 4, the p-channel transistor 4 is shifted into a conducting state, thereby stepping up the potential of the output signal OUT. When the potential of the output signal OUT is stepped up, the p-channel transistor 3 is shifted to a non-conducting state, which results in an increase in the conduction resistance of the p-channel transistor 3 and a further drop in the potential of the inverted output signal XOUT. With the above-described positive feedback, the operation for changing the output signal OUT to 3 V and the inverted output signal XOUT to 0 V and thereby shifting the input signals IN and XIN, which are at a low amplitude level (0.7 V), to high amplitude level (3 V) output signals OUT and XOUT, is completed.

Moreover, with the present embodiment, when the output signal OUT becomes 3 V, the first p-channel transistor 5 for substrate bias becomes non-conducting, thereby blocking the route over which the input signal IN flows to the substrate of the first n-channel transistor 1 for signal input, and thus passing-through current to the substrate is prevented and unnecessary power consumption can be reduced. The above description was made using the time that the input signal IN rises and changes as an example, but the above description can be similarly applied to the time that the inverted input signal XIN rises and changes as well, and thus a description thereof has been omitted.

Thus, with the level shift circuit of the present embodiment, it is possible to generate substrate bias in the first and the second n-channel substrates 1 and 2 for signal input only at the time that the input signals IN and XIN are rising and changing, and thus operation that is both high-speed and low-power can be achieved even if there is further progress in reducing the voltage of the input signals IN and XIN.

Figure 3A:
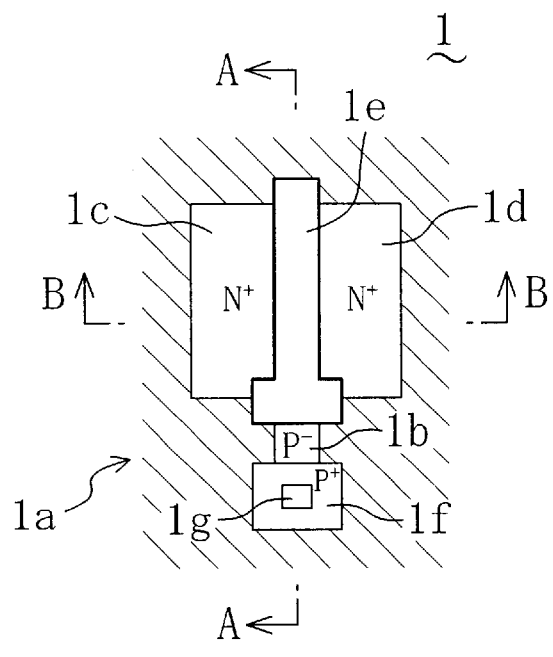
FIG. 3A is a plan view showing the layout of a transistor for signal input that is provided in the level shift circuit.
Figure 3B:
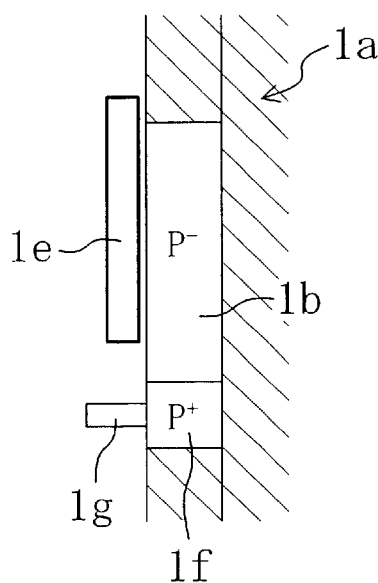
FIG. 3B is a cross-sectional view taken along the ling A—A in FIG. 3A.
Figure 3C:
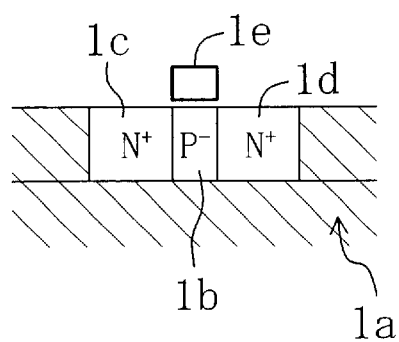
FIG. 3C is a cross-sectional view taken along the line B—B in FIG. 3A.

Next, the structural layout of the first n-channel transistor 1 for signal input is shown in FIG. 3. FIG. 3A is a plan view, FIG. 3B is a cross-sectional view taken along the line A—A in FIG. 3A, and FIG. 3C is a cross-sectional view taken along the line B—B in FIG. 3A. In FIGS. 3A to 3C, the first n-channel transistor 1 for signal input has an SOI (silicon on insulator) structure. That is, the first n-channel transistor 1 for signal input includes an insulating plate (insulating substrate) $1a$ having a back gate electrode (substrate) $1b$ made of a p$^-$ layer, two n$^+$ regions $1c$ and $1d$ positioned to the left and right of the back gate electrode $1b$ as source and drain electrodes, and a gate electrode $1e$ formed above the p$^{-\ layer}$ $1b$. Moreover, to allow the input signal IN to be input at the back gate electrode (substrate) $1b$ as mentioned above, the back gate electrode $1b$ extends downward in FIG. 3A with its lateral ends contacting a p$^+$ layer $1f$, and a contact $1g$ to which the input signal IN is input connected to the p$^+$ layer $1f$. The above description pertains to the structural layout of the first n-channel transistor 1 for signal input, but the layout is the same for the layout of the second n-channel transistor 2 for signal input, and thus a description thereof is omitted.

Figure 4A:
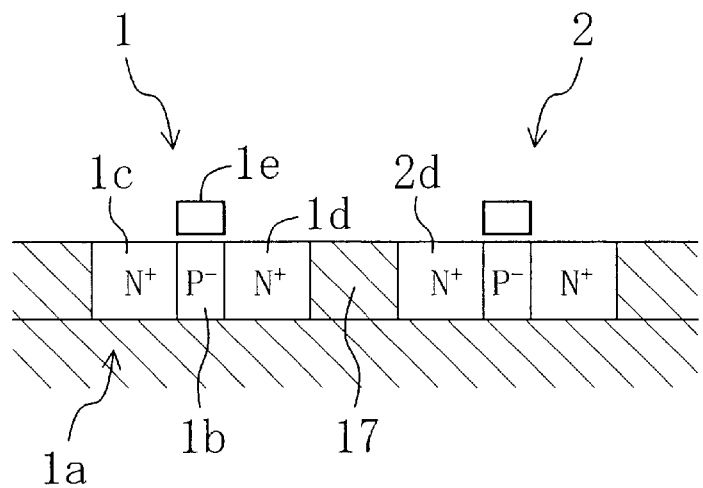
FIG. 4A is a cross-sectional view showing a layout in which two of the transistors for signal input are arranged side by side.
Figure 4B:
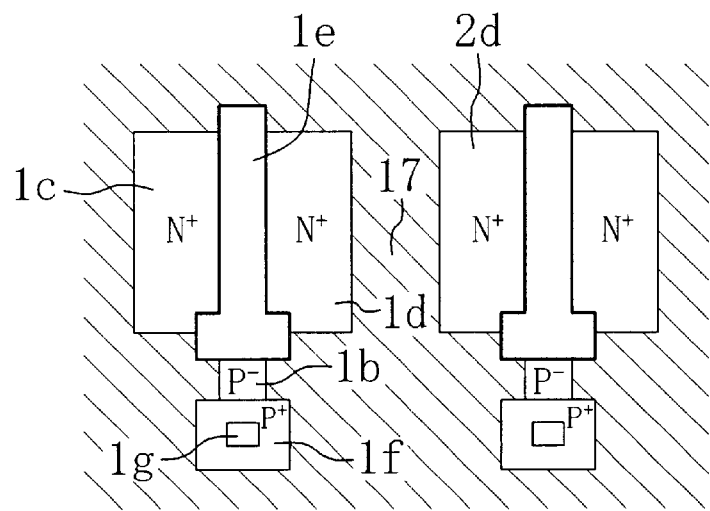
FIG. 4B is a plan view of the same.

FIGS. 4A and 4B show a layout in which the first and the second n-channel transistors 1 and 2 for signal input are arranged side by side. FIG. 4A is a cross-sectional view and FIG. 4B is a plan view. In FIGS. 4A and 4B, the first and the second n-channel transistors 1 and 2 for signal input are arranged with their gate electrodes extending parallel to one another, and as can be understood from FIG. 4A, an insulating layer 17 insulates the region between the n$^+$ regions $1d$ and $2d$ adjacent to the first and second n-channel transistors 1 and 2 for signal input.

Figure 14A:
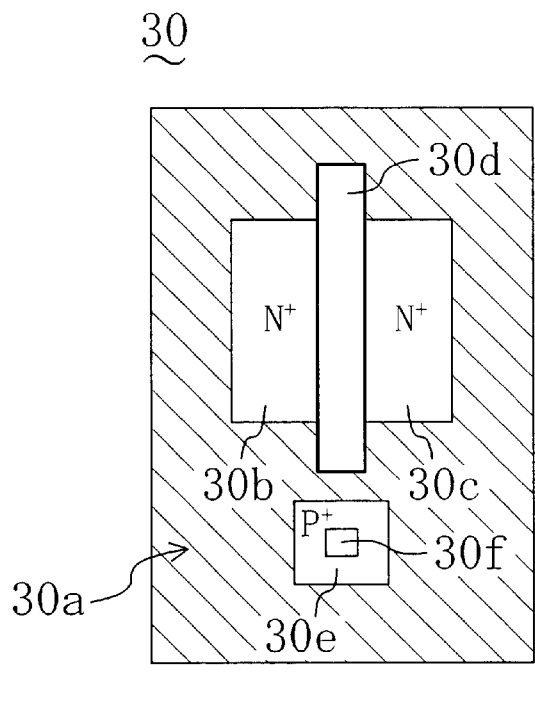
FIG. 14A is a plan view showing the layout of an ordinary transistor.
Figure 14B:
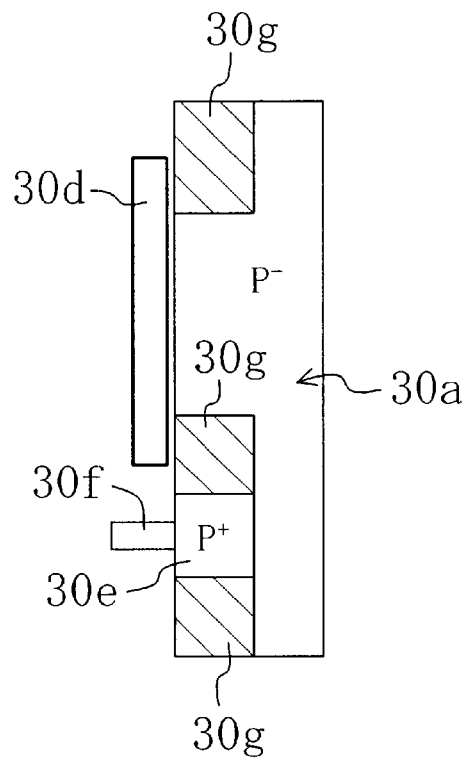
FIG. 14B is a vertical cross-sectional view of the same.
Figure 14C:
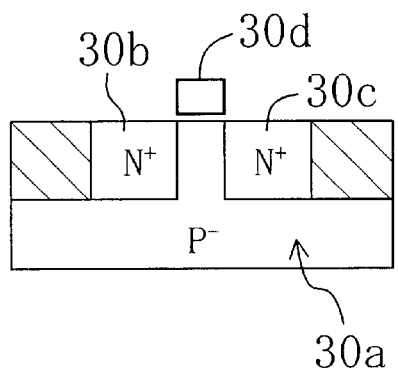
FIG. 14C is a transverse cross-sectional view of the same.
Figure 15A:
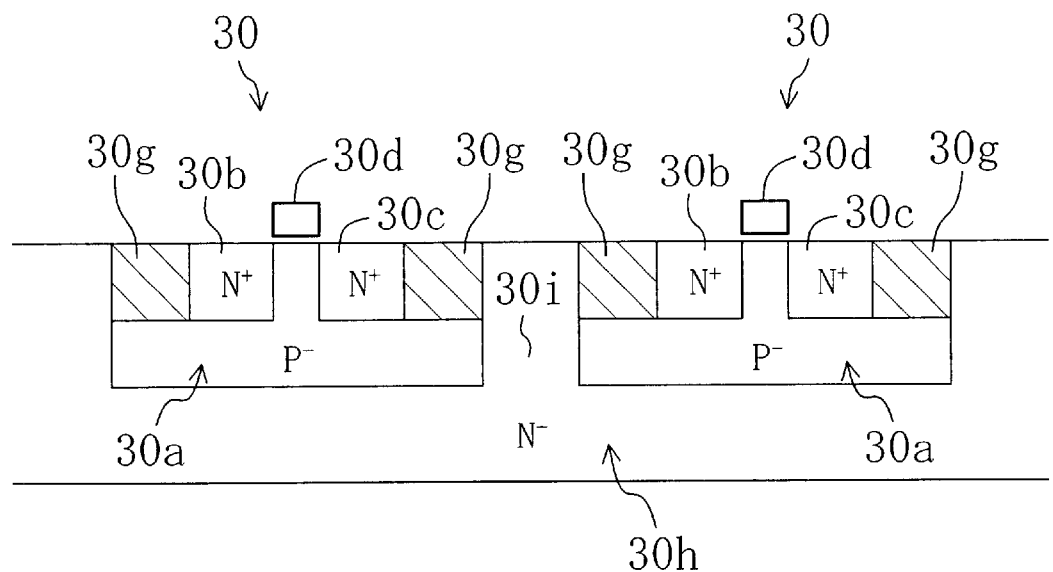
FIG. 15A is a cross-sectional view showing a layout in which two transistors are formed in a triple-well structure.
Figure 15B:
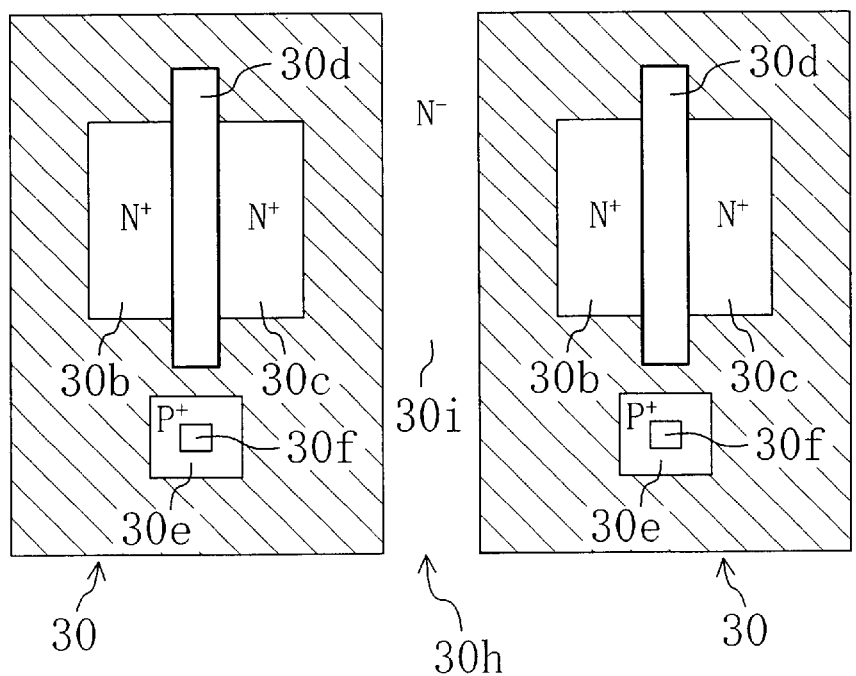
FIG. 15B is a plan view of the same.

Here, to draw a comparison with the SOI configuration, the configuration of a bulk CMOS transistor will be described. FIGS. 14A and 14B show the structural layout of a single transistor 30. In these drawings, the transistor 30 has a substrate 30a made of a p⁻ layer, two n⁺ regions 30b and 30c formed on top of the substrate 30a with a predetermined spacing between them to serve as source and drain electrodes, and a gate electrode 30d formed above the p⁻ region positioned between the n⁺ regions 30b and 30c. Moreover, in this configuration, in order for the input signal IN to be input by the p⁻ substrate 30a, a p⁺ region 30e is formed on top of the p⁻ substrate 30a on an extended line from the gate electrode 30d at a predetermined spacing, and a contact 30f at which the input signal IN is input connected to the p⁺ region 30e. It should be noted that the reference numeral 30g in the drawings denotes an insulating layer. FIGS. 15A and 15B show a layout in which two transistors 30 are arranged side by side. In FIGS. 15A and 15B, a triple-well structure is adopted in which a substrate 30h made of an n⁻ layer is arranged below the p⁻ substrates 30a and 30a of the two transistors 30 and 30, and a partial region 30i of the n⁻ substrate 30h is positioned between the transistors 30 and 30 so as to isolate the substrates 30a and 30a of the two transistors 30 and 30 from one another.

Consequently, whereas the transistors 1 and 2 are isolated by only one insulating layer 17 if formed using the SOI configuration according to the present embodiment shown in FIG. 4, the triple-well structure shown in FIG. 15 requires the region 30i and two insulating regions 30g and 30g in order to isolate the two transistors 30 and 30 from one another. Thus, with the present embodiment, the first and the second n-channel transistors 1 and 2 for signal input, which are shown in FIG. 1, are formed in an SOI structure, and thus it is not necessary to provide the isolation region 30i and one of the insulating layers 30g shown in FIG. 15, allowing the layout area to be reduced accordingly and a more highly integrated level shift circuit to be achieved.

Figure 2:
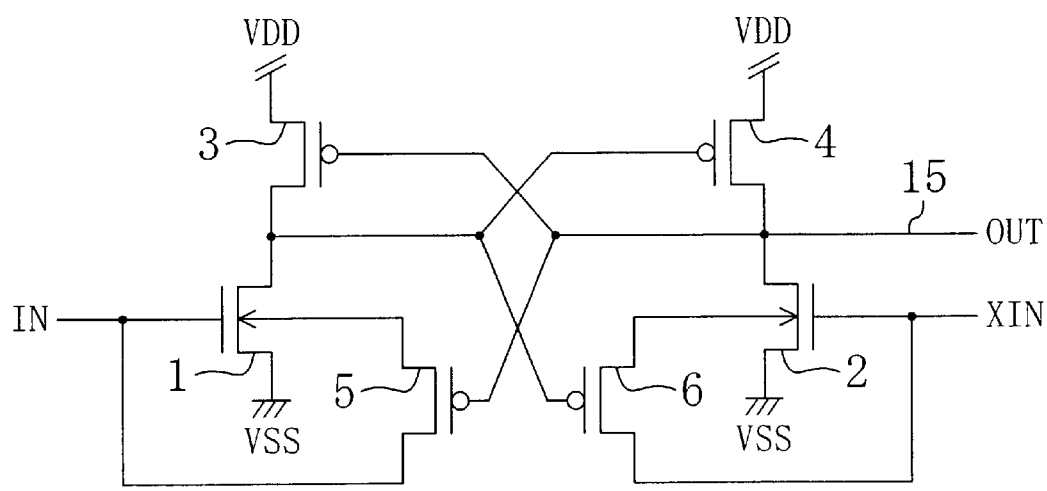
FIG. 2 is a diagram showing a modified example of the level shift circuit of Embodiment 1.

It should be noted that in the present embodiment, the signal lines 15 and 16 were connected and both the output signal OUT and the inverted output signal XOUT were output, however, the invention is not limited to this, and alternatives of course include adopting the configuration shown in FIG. 2, in which only one of the output signal OUT and the inverted output signal XOUT is output (in FIG. 2, only the signal line 15 is connected so as to output only the output signal OUT).

MODIFIED EXAMPLE OF THE EMBODIMENT 1

Figure 5:
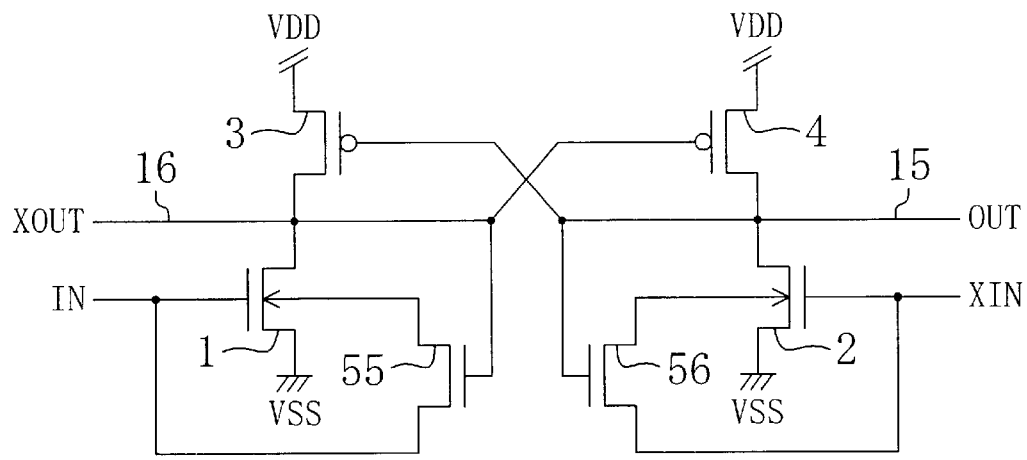
FIG. 5 is a diagram showing a modified example in which the first and the second p-type transistors for substrate bias in the level shift circuit according to Embodiment 1 shown in FIG. 1 are achieved by n-type transistors.

FIG. 5 shows a modified example of the level shift circuit according to Embodiment 1 shown in FIG. 1. With the level shift circuit in FIG. 5, the first and the second p-channel transistors 5 and 6 for substrate bias of the level shift circuit in FIG. 1 are replaced by first and second transistors 55 and 56 for substrate bias, both of which are n-channel transistors. Also, along with the change in polarity of the transistors from p-channel to n-channel transistors, at the gate electrode of the first n-channel transistor 55 for substrate bias the inverted output signal XOUT is input in place of the output signal OUT, and at the gate electrode of the second n-channel transistor 56 for substrate bias the output signal OUT is input in place of the inverted output signal XOUT.

More specifically, at the source electrode of the first n-channel transistor 55 for substrate bias the input signal IN is input, its drain electrode is connected to the substrate of the first n-channel transistor 1 for signal input, and at its gate electrode the inverted output signal XOUT is input. Also, at the source electrode of the second n-channel transistor 56 for substrate bias the inverted input signal XIN is input, its drain electrode is connected to the substrate of the second n-channel transistor 2 for signal input, and at its gate electrode the output signal OUT is input.

Consequently, in this modified example, the first and the second n-channel transistors 55 and 56 for substrate bias operate identically to the first and the second p-channel transistors 5 and 6 for substrate bias shown in FIG. 1, and thus the same effects as those of the level shift circuit of Embodiment 1 are achieved.

Moreover, with this modified example, the input signal IN and the inverted input signal XIN, which are both low voltage, are input at the source electrodes of the first and the second n-channel transistors 55 and 56 for substrate bias and the inverted output signal XOUT and the output signal OUT, which are both high voltage, are input at their gate electrodes, and thus the voltage of the input signal IN and the inverted input signal XIN at the source electrodes of the n-channel transistors 55 and 56 is transmitted to the substrates without leading to a drop in threshold voltages of the n-channel transistors 55 and 56. In addition, under identical gate width conditions, the n-channel transistors 55 and 56 for substrate bias have a higher drive power than the p-channel transistors 5 and 6 for substrate bias shown in FIG. 1, and thus the n-channel transistors can be given a narrower gate than the p-channel transistors 5 and 6, which allows the transistors to be reduced in size accordingly.

Figure 6:
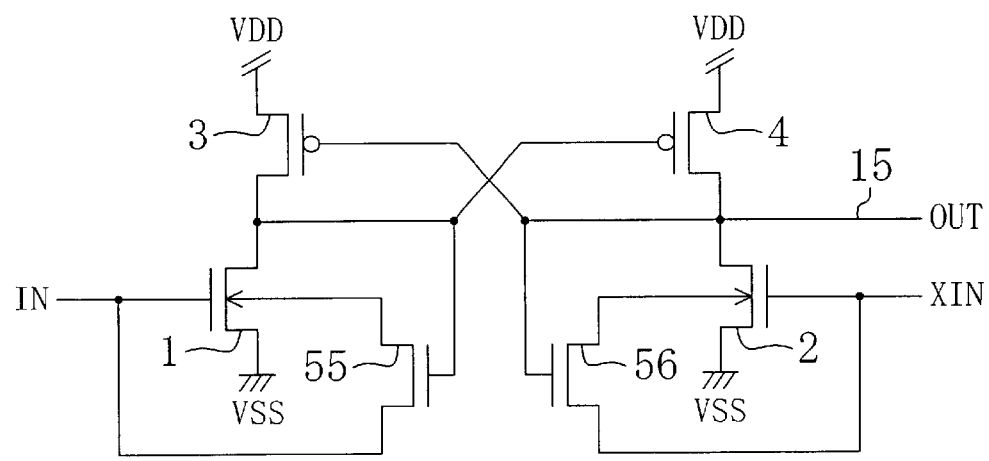
FIG. 6 is a diagram showing a modified example in which the first and the second p-type transistors for substrate bias of the level shift circuit of the modified example shown in FIG. 2 are achieved by n-type transistors.

FIG. 6 is a diagram in which the first and the second p-channel transistors 5 and 6 for substrate bias that are provided in the level shift circuit shown in FIG. 2 are achieved using the n-channel transistors 55 and 56 for substrate bias.

EMBODIMENT 2

Figure 7:
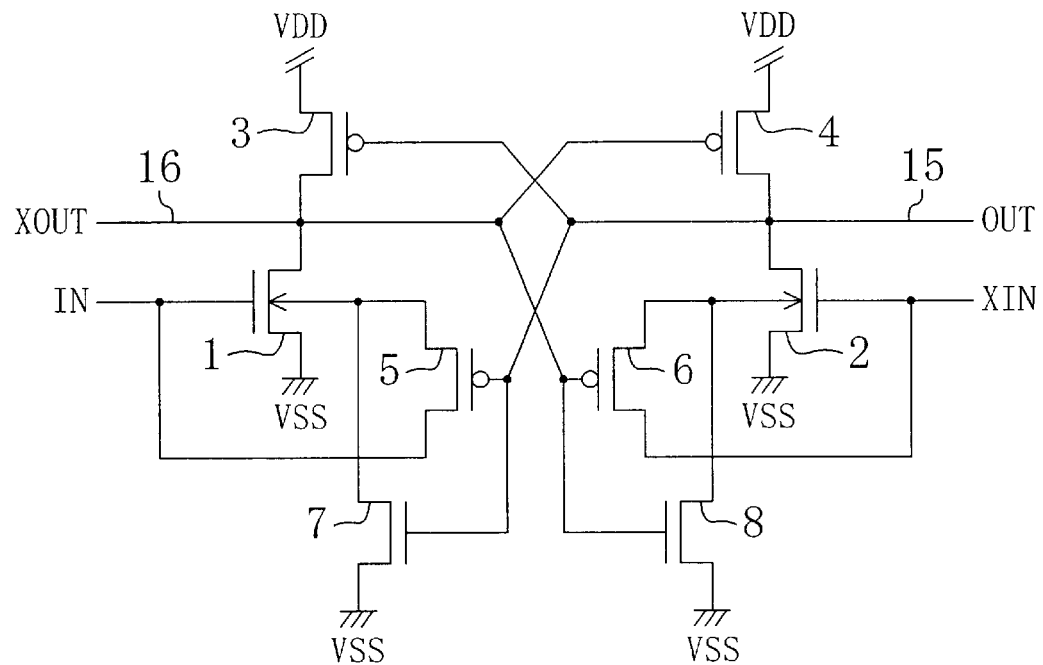
FIG. 7 is a diagram showing the configuration of the level shift circuit of Embodiment 2 according to the invention.

FIG. 7 shows the level shift circuit according to Embodiment 2 of the invention.

The level shift circuit shown in FIG. 7 is characterized in that it includes the level shift circuit according to Embodiment 1 in addition to first and second n-channel transistors 7 and 8 for resetting. The source electrode of the first n-channel transistor 7 for resetting is connected to the ground power source (low voltage power source) VSS, its drain electrode is connected to the substrate of the first n-channel transistor 1 for signal input, and at its gate electrode the output signal OUT of the signal line 15 is input. Similarly, the source electrode of the second n-channel transistor 8 for resetting is connected to the ground power source VSS, its drain electrode is connected to the substrate of the second n-channel transistor 2 for signal input, and at its gate electrode the inverted output signal XOUT of the signal line 16 is input.

The level shift circuit of this embodiment has the same basic structure as in Embodiment 1, and thus achieves the same effects as Embodiment 1. These are that a substrate bias effect is generated in either the first or the second n-channel transistor 1 or 2 for signal input only when the input signal IN or the inverted input signal XIN rises and changes, so that even if the voltage level of the signals IN and XIN is reduced through further advances, the first or the second n-channel transistor 1 or 2 into whose gate electrode the signal is input is very quickly shifted to a conducting state, thereby obtaining a level shift circuit with which level shifting can be performed at high speeds. Also, the route over which the signals IN and XIN flow to the substrate of the first or the second n-channel transistor 1 or 2 is blocked by the first and the second p-type transistors 5 and 6 for substrate bias, thereby preventing a constant flow of passing-through current and allowing lower power consumption to be achieved.

Moreover, with the present embodiment, for example, after the input signal IN has risen to a high voltage level (0.7 V) so as to change the output signal OUT to a high voltage level (3 V), the high voltage level output signal OUT causes the first n-channel transistor 7 for resetting to become conducting, thereby resetting the potential of the substrate of the first n-channel transistor 1 for signal input to the potential of the ground power source VSS. Consequently, after the input signal IN subsequently falls from the high voltage level (0.7 V) to the low voltage level (0 V), causing the first n-channel transistor 1 for signal input to become non-conducting, then, as the input signal IN next rises from the low voltage level (0 V) to the high voltage level (0.7 V), when the input signal IN passes through the first p-channel transistor 5 for substrate bias and flows to the substrate of the first n-channel transistor 1 for signal input, that substrate potential is necessarily increased over the potential of the ground power source, and thus the history effect of the operations of the first n-channel transistor 1 for signal input is suppressed, effectively inhibiting variation due to operation delay. The operation and action of the second n-channel transistor 8 for resetting are identical to those described above, and thus will not be described.

Consequently, with this embodiment, the first and the second n-channel transistors 7 and 8 for resetting allow the first and the second n-channel transistors 1 and 2 for signal input to prepare for the next rise and change in the input signal IN and the inverted input signal XIN with the same substrate conditions each time, and thus allows the n-channel transistors 1 and 2 to operate at a uniform operating speed each time.

Figure 8:
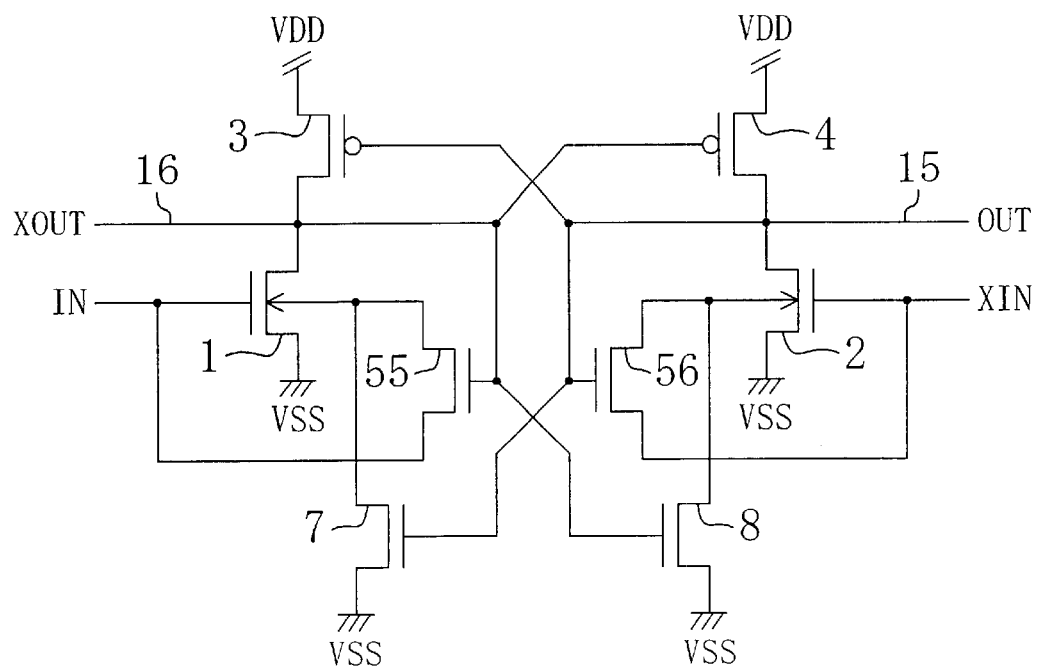
FIG. 8 is a diagram showing a modified example in which the first and the second p-type transistors for substrate bias in the level shift circuit shown in FIG. 7 are achieved by n-type transistors.

FIG. 8 is a diagram showing a modified example in which the first and the second p-type transistors 5 and 6 for substrate bias in the level shift circuit according to the present embodiment shown in FIG. 7 are achieved using the n-type transistors 55 and 56. This modified example achieves the same effects as the level shift circuit of the present embodiment.

It should be noted that if the transistors 1 and 2 for signal input that are shown in FIGS. 7 and 8 are formed in the SOI structure shown in FIG. 4, then, as mentioned previously, the layout area necessary for isolating the transistors 1 and 2 from one another can be reduced and a more highly integrated level shift circuit can be achieved. Moreover, with the level shift circuits shown in FIGS. 7 and 8 according to the present embodiment and the modified example, it is of course also possible to output only one of the output signal OUT and the inverted output signal XOUT.

EMBODIMENT 3

Figure 9:
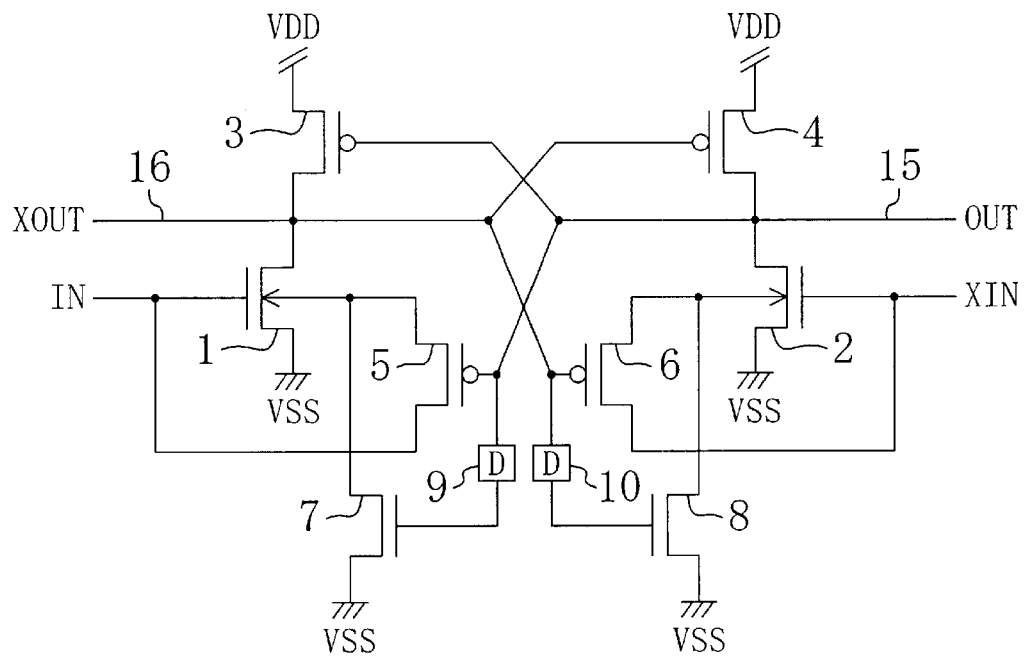
FIG. 9 is a diagram showing the configuration of the level shift circuit of Embodiment 3 according to the invention.

FIG. 9 shows the level shift circuit according to Embodiment 3 of the invention. The level shift circuit in FIG. 9 is characterized in having the configuration of the level shift circuit according to Embodiemnt 2 shown in FIG. 7 in addition to first and second delay elements 9 and 10. The first delay element 9 is arranged between the signal line 15 for the output signal OUT and the gate electrode of the first n-channel transistor 7 for resetting. The second delay element 10 is arranged between the signal line 16 for the inverted output signal XOUT and the gate electrode of the second n-channel transistor 8 for resetting.

The level shift circuit of this embodiment has the configuration of the level shift circuit according to Embodiment 2, and thus achieves the following effects. As mentioned previously, these are that a substrate bias effect is generated in the first and the second n-channel transistors 1 and 2 for signal input, into which the input signal IN or the inverted input signal MN are input, only when these signals rise and change, and even if the voltage level of the signals IN and XIN is further reduced, it is possible to achieve high-speed low-power operation. Also, the substrate potential is reset to the potential of the ground power source VSS before the n-channel transistors 1 and 2 operate conductively, so that variation in the operating speed of the first and the second n-type transistors 1 and 2 for signal input, into which these signals are input, can be effectively inhibited.

Moreover, with the present embodiment, the first delay element 9 is arranged between the between the signal line 15 for the output signal OUT and the gate electrode of the first n-channel transistor 7 for resetting, and the second delay element 10 is arranged between the signal line 16 for the inverted output signal XOUT and the gate electrode of the second n-channel transistor 8 for resetting. Thus, the n-channel transistors 7 and 8 for resetting become conducting later than in Embodiment 2 by the amount of temporal delay dictated by the first and the second delay elements 9 and 10, and thus the timing at which the substrate potential of the first and the second n-channel transistors 1 and 2 for signal input is reset to the potential of the ground power source VSS is delayed by the amount of this temporal delay. Consequently, for example, when the rise of the input signal IN makes the first n-channel transistor 1 for signal input conducting, causing the inverted output signal XOUT to move toward a low voltage level (0 V) and the output signal OUT to move toward a high voltage level (3 V), the first n-channel transistor 1 for signal input maintains high performance as it quickly lowers the inverted output signal XOUT to 0 V, and after the change in the signal is complete, it is finally possible reset the substrate potential of the first n-channel transistor 1 for signal input to 0 V in preparation of the subsequent signal change. This allows the high-speed operation of the first and the second n-channel transistors 1 and 2 for signal input to be maintained until the signal change is complete, while effectively inhibiting variation in the operating speed of the transistors.

Figure 10:
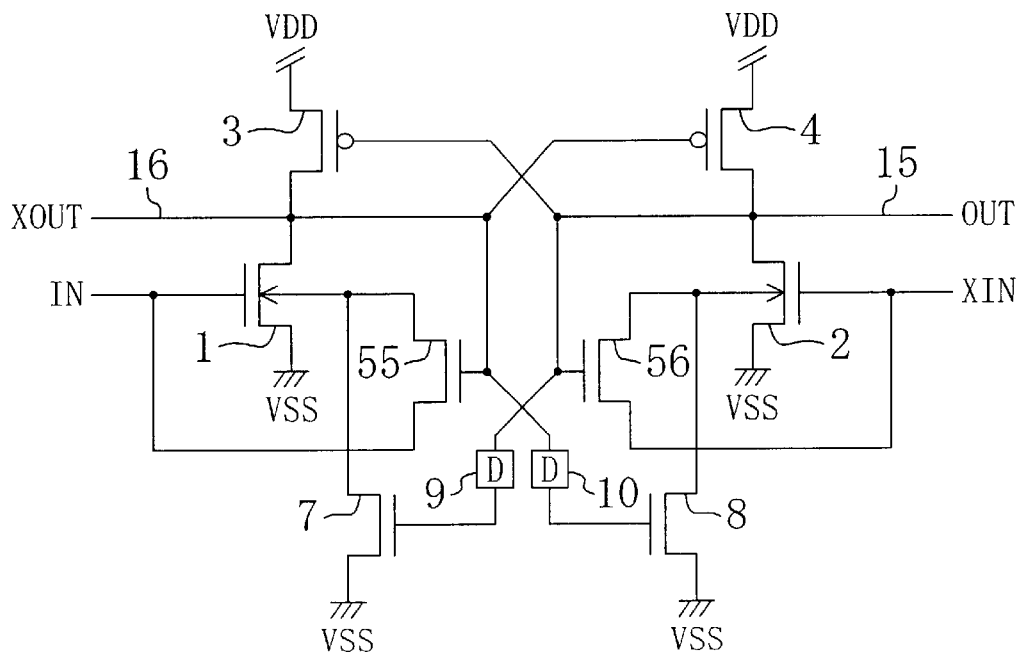
FIG. 10 is a diagram showing a modified example in which the first and the second p-type transistors for substrate bias in the level shift circuit shown in FIG. 9 are achieved by n-type transistors.

FIG. 10 is a diagram showing a modified example in which the first and the second p-type transistors 5 and 6 for substrate bias in the level shift circuit of the present embodiment shown in FIG. 9 are achieved using the n-type transistors 55 and 56. This configuration yields the same effects as the level shift circuit of the present embodiment.

It should be noted that if the transistors 1 and 2 for signal input that are shown in FIGS. 9 and 10 adopt the SOI structure shown in FIG. 4, then, as mentioned previously, the layout area necessary for isolating the substrates of the transistors 1 and 2 from one another can be reduced and a more highly integrated level shift circuit can be achieved. Moreover, with the level shift circuits shown in FIGS. 9 and 10 according to the present embodiment and the modified example, it is of course also possible to output only one of the output signal OUT and the inverted output signal XOUT.

EMBODIMENT 4

Figure 11:
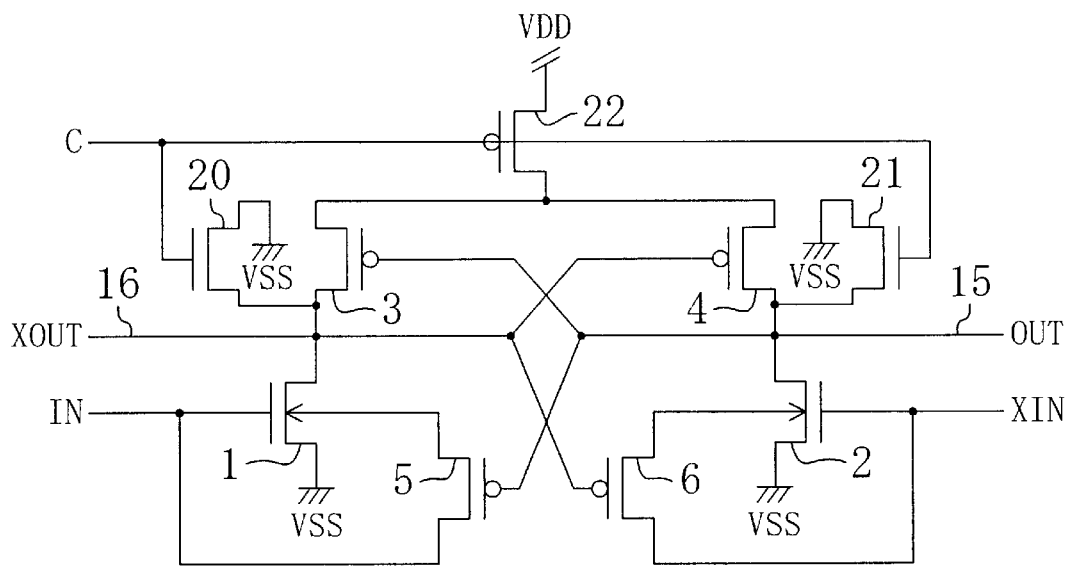
FIG. 11 is a diagram showing the configuration of the level shift circuit of Embodiment 4 according to the invention.

FIG. 11 shows the level shift circuit according to Embodiment 4 of the invention. The level shift circuit shown in FIG. 11 has a shutdown function, and is characterized by having first and second n-channel transistors 20 and 21 for shutdown and a p-channel transistor 22 for blocking in addition to the configuration of the level shift circuit according to Embodiment 1 shown in FIG. 1.

In FIG. 11, the source electrodes of the first and the second n-channel transistors 20 and 21 for shutdown are connected to the ground power source VSS, and at their gate electrodes a control signal C is input. The drain electrode of the first n-channel transistor 20 for shutdown is connected to the drain electrode of the first n-channel transistor 1 for signal input, and the drain electrode of the second n-channel transistor 21 for shutdown is connected to the drain electrode of the second n-channel transistor 2 for signal input. The control signal C is a signal that becomes "H" level when the power source for the circuit that outputs the input signal IN and the inverted input signal XIN is shut down, and is "L" level at all other times. Also, the source electrode of the p-channel transistor 22 for blocking is connected to the high voltage power source VDD, its drain electrode is connected to the source electrodes of the first and the second p-channel transistors 3 and 4, and at its gate electrode the control signal C is input.

The level shift circuit of the present embodiment includes the configuration of the level shift circuit according to Embodiment 1, and thus, as mentioned previously, a substrate bias effect can be generated in the n-channel transistors 1 and 2 for signal input, into whose gate electrodes the input signal IN and the inverted input signal XIN are input, only when the input signal IN and the inverted input signal XIN are rising and changing, thereby allowing high-speed and low-power operation to be achieved even if the input signal IN and the inverted input signal XIN are reduced in voltage.

Moreover, with the present embodiment, when the power source of the circuit that outputs the input signal IN and the inverted input signal XIN is shut down, the control signal C becomes "H" level, which shifts the p-channel transistor 22 for blocking into a non-conducting state and shifts the first and the second n-channel transistors 20 and 21 for shutdown into a conducting state. As a result, the passing-through current route from the high voltage power source VDD to the ground power source VSS by way of either the first or the second n-channel transistor 1 or 2 for signal input is blocked by the p-channel transistor 22 for blocking, and the source and the drain electrodes of the first and the second n-channel transistors 1 and 2, into which either the input signal IN or the inverted input signal XIN are input, are both connected to the ground power source VSS, so that even if the potential of the input signal IN or the inverted input signal XIN is unstable during shutdown, for example, the flow of passing-through current that results from the series connected n-channel transistor 1 and p-channel transistor 3 or the series connected n-channel transistor 2 and p-channel transistor 4 both becoming conductive can be reliably prevented. Also, the output signal and the inverted output signal are both held constant at the ground potential, so that passing-through current can also be prevented from flowing to circuits at later stages.

Figure 12:
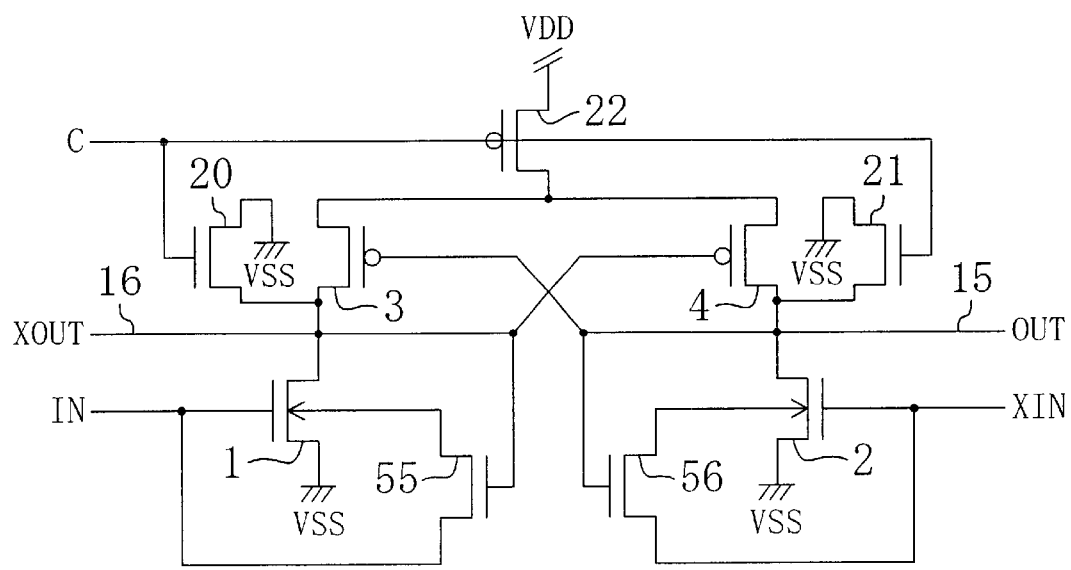
FIG. 12 is a diagram showing a modified example in which the first and the second p-type transistors for substrate bias in the level shift circuit shown in FIG. 11 are achieved by n-type transistors.
Figure 13:
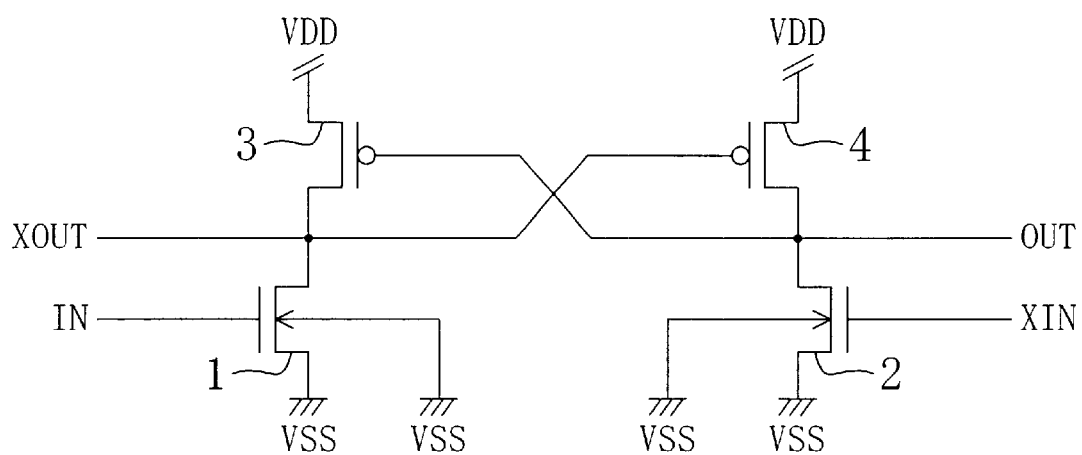
FIG. 13 is a diagram showing the configuration of a conventional level shift circuit.

FIG. 12 is a diagram showing a modified example in which the first and the second p-type transistors 5 and 6 for substrate bias in the level shift circuit of the present embodiment shown in FIG. 11 are achieved using the n-type transistors 55 and 56. This configuration yields the same effects as the level shift circuit of the present embodiment.

It should be noted that if the transistors 1 and 2 for signal input shown in FIGS. 11 and 12 adopt the SOI structure shown in FIG. 4, then, as mentioned previously, the layout area necessary for isolating the substrates of the transistors 1 and 2 from one another can be reduced and a more highly integrated level shift circuit can be achieved. Moreover, with the level shift circuits shown in FIGS. 11 and 12 according to the present embodiment and the modified example, it is of course also possible to output only one of the output signal OUT and the inverted output signal XOUT.

In addition, the configuration of the present embodiment and modified example shown in FIGS. 11 and 12 is the basic configuration of the level shift circuit shown in FIGS. 1 and 5, however, it is of course also possible to adopt the basic configuration of the level shift circuit shown in any of FIGS. 7 to 10 and additionally provide the n-channel transistors 20 and 21 for shutdown and the p-channel transistor 22 for blocking.

Moreover, in Embodiments 1 to 4, the level shift circuits were described including p-channel transistors 3 and 4, however, the invention is not limited to this, and is applicable to various alternative level shift configurations, as long as at least the first and the second n-channel transistors 1 and 2 for signal input are provided.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A level shift circuit, into which an input signal and an inverted input signal are input, which shifts an amplitude level of the input signal and the inverted input signal to an amplitude level that is higher than that amplitude level, and which outputs at least one of an output signal and an inverted output signal having the amplitude level after shifting, the level shift circuit comprising:

a first n-type transistor for signal input, into whose gate electrode the input signal is input;

a second n-type transistor for signal input, into whose gate electrode the inverted input signal is input;

a first p-type transistor for substrate bias, into whose source electrode the input signal is input, whose drain electrode is connected to a substrate of the first n-type transistor for signal input, and into whose gate electrode the output signal is input; and a second p-type transistor for substrate bias, into whose source electrode the inverted input signal is input, whose drain electrode is connected to a substrate of the second n-type transistor for signal input, and into whose gate electrode the inverted output signal is input.

2. The level shift circuit according to claim 1, further comprising:

a first n-type transistor for resetting, whose source electrode is connected to a low voltage power source, whose drain electrode is connected to the substrate of the first n-type transistor for signal input, and into whose gate electrode the output signal is input; and a second n-type transistor for resetting, whose source electrode is connected to the low voltage power source, whose drain electrode is connected to the substrate of the second n-type transistor for signal input, and into whose gate electrode the inverted output signal is input.

3. The level shift circuit according to claim 2, further comprising:

a first delay element connected to the gate electrode of the first n-type transistor for resetting, and which is for delaying input of the output signal to that gate electrode; and a second delay element connected to the gate electrode of the second n-type transistor for resetting, and which is for delaying input of the inverted output signal to that gate electrode.

4. The level shift circuit according to any of claims 1 to 3, wherein the inverted output signal and the output signal are input into the drain electrodes of the first and the second n-type transistors for signal input, respectively, the level shift circuit further comprising:

a p-type transistor for blocking, which is arranged on a route connecting a high voltage power source to the drain electrodes of the first and the second n-type transistors for signal input, into whose gate electrode a control signal is input, and which becomes non-conducting when a power source of a circuit that outputs the input signal and the inverted input signal is shut down; and first and second n-type transistors for shutdown, arranged between the drain electrodes of the first and the second n-type transistors for signal input and the low voltage power source, respectively, into whose gate electrodes the control signal is input, and which become conducting during the shut down.

5. The level shift circuit according to any of claims 1 to 3, wherein at least the first and the second n-type transistors for signal input are formed on an insulating substrate.

6. The level shift circuit according to any of claims 1 to 3, wherein a signal line is connected to the drain electrode of at least one of the first and the second n-type transistors for signal input, and through the signal line, only one of the output signal and the inverted output signal is output.

7. A level shift circuit, into which an input signal and an inverted input signal are input, which shifts an amplitude level of the input signal and the inverted input signal to an amplitude level that is higher than that amplitude level, and which outputs at least one of an output signal and an inverted output signal having the amplitude level after shifting, the level shift circuit comprising:

a first n-type transistor for signal input, into whose gate electrode the input signal is input;

a second n-type transistor for signal input, into whose gate electrode the inverted input signal is input;

a first n-type transistor for substrate bias, into whose source electrode the input signal is input, whose drain electrode is connected to a substrate of the first n-type transistor for signal input, and into whose gate electrode the inverted output signal is input; and a second n-type transistor for substrate bias, into whose source electrode the inverted input signal is input, whose drain electrode is connected to a substrate of the second n-type transistor for signal input, and into whose gate electrode the output signal is input.

8. The level shift circuit according to claim 7, further comprising:

a first n-type transistor for resetting, whose source electrode is connected to a low voltage power source, whose drain electrode is connected to the substrate of the first n-type transistor for signal input, and into whose gate electrode the output signal is input; and a second n-type transistor for resetting, whose source electrode is connected to the low voltage power source, whose drain electrode is connected to the substrate of the second n-type transistor for signal input, and into whose gate electrode the inverted output signal is input.

9. The level shift circuit according to claim 8, further comprising:

a first delay element connected to the gate electrode of the first n-type transistor for resetting, and which is for delaying input of the output signal to that gate electrode; and a second delay element connected to the gate electrode of the second n-type transistor for resetting, and which is for delaying input of the inverted output signal to that gate electrode.

10. The level shift circuit according to any of claims 7 to 9, wherein the inverted output signal and the output signal are input into the drain electrodes of the first and the second n-type transistors for signal input, respectively, the level shift circuit further comprising:

a p-type transistor for blocking, which is arranged on a route connecting a high voltage power source to the drain electrodes of the first and the second n-type transistors for signal input, into whose gate electrode a control signal is input and which becomes non-conducting when a power source of a circuit that outputs the input signal and the inverted input signal is shut down; and first and second n-type transistors for shutdown, arranged between the drain electrodes of the first and the second n-type transistors for signal input and the low voltage power source, respectively, into whose gate electrodes the control signal is input, and which become conducting during the shut down.

11. The level shift circuit according to any of claims 7 to 9, wherein at least the first and the second n-type transistors for signal input are formed on an insulating substrate.

12. The level shift circuit according to any of claims 7 to 9, wherein a signal line is connected to the drain electrode of at least one of the first and the second n-type transistors for signal input, and through the signal line, only one of the output signal and the inverted output signal is output.

* * * * *